United States Patent
Bae et al.

(10) Patent No.: US 8,537,506 B2
(45) Date of Patent: Sep. 17, 2013

(54) INFORMATION STORAGE DEVICE WITH DOMAIN WALL MOVING UNIT AND MAGNETO-RESISTIVE DEVICE MAGNETIZATION ARRANGEMENT

(75) Inventors: Ji-young Bae, Seongnam-si (KR); Sung-chul Lee, Osan-si (KR); Sun-ae Seo, Hwaseong-si (KR); Young-jin Cho, Suwon-si (KR); Ung-hwan Pi, Seoul (KR); Jin-seong Heo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 336 days.

(21) Appl. No.: 12/801,712

(22) Filed: Jun. 22, 2010

(65) Prior Publication Data

US 2011/0085258 A1    Apr. 14, 2011

(30) Foreign Application Priority Data

Oct. 14, 2009    (KR) .................. 10-2009-0097736

(51) Int. Cl.
G11B 5/39        (2006.01)
(52) U.S. Cl.
USPC ................................... 360/324.12
(58) Field of Classification Search
USPC .............. 360/318, 318.1, 324.1, 324.12
See application file for complete search history.

(56) References Cited

U.S. PATENT DOCUMENTS

| | | | |
|---|---|---|---|
| 5,549,978 A | | 8/1996 | Iwasaki et al. |
| 7,385,790 B2 | | 6/2008 | Inomata et al. |
| 2002/0064006 A1* | | 5/2002 | Hasegawa ............... 360/324.12 |
| 2004/0252539 A1 | | 12/2004 | Parkin |
| 2005/0264948 A1* | | 12/2005 | Nakamoto et al. ........... 360/319 |
| 2006/0120132 A1* | | 6/2006 | Parkin ........................... 365/80 |
| 2007/0279810 A1* | | 12/2007 | Funayama et al. ......... 360/324.1 |
| 2009/0080125 A1 | | 3/2009 | Kondo |

FOREIGN PATENT DOCUMENTS

| | | |
|---|---|---|
| JP | 2008-028362 | 2/2008 |
| KR | 10-0136073 | 1/1998 |
| KR | 10-2005-0095881 | 10/2005 |
| KR | 10-2009-0030318 | 3/2009 |

* cited by examiner

*Primary Examiner* — Craig A. Renner
(74) *Attorney, Agent, or Firm* — Harness, Dickey & Pierce, P.L.C.

(57) ABSTRACT

An information storage device includes a magnetic track and a magnetic domain wall moving unit. The magnetic track has a plurality of magnetic domains and a magnetic domain wall between each pair of adjacent magnetic domains. The magnetic domain wall moving unit is configured to move at least the magnetic domain wall. The information storage device further includes a magneto-resistive device configured to read information recorded on the magnetic track. The magneto-resistive device includes a pinned layer, a free layer and a separation layer arranged there between. The pinned layer has a fixed magnetization direction. The free layer is disposed between the pinned layer and the magnetic track, and has a magnetization easy axis, which is non-parallel to the magnetization direction of the pinned layer.

12 Claims, 10 Drawing Sheets

INFORMATION STORAGE DEVICE WITH DOMAIN WALL MOVING UNIT AND MAGNETO-RESISTIVE DEVICE MAGNETIZATION ARRANGEMENT

CROSS-REFERENCE TO RELATED APPLICATION(S)

This application claims priority under 35 U.S.C. §119 to Korean Patent Application No. 10-2009-0097736, filed on Oct. 14, 2009, in the Korean Intellectual Property Office, the disclosure of which is incorporated herein in its entirety by reference.

BACKGROUND

1. Field

Example embodiments relate to information storage devices including magneto-resistive devices and methods of operating information storage devices.

2. Description of the Related Art

Non-volatile information storage devices retain recorded information even when power is cut off. Examples of conventional non-volatile information storage devices include hard disk drives (HDDs), non-volatile random access memories (RAMs), etc.

Generally, an HDD is a storage device having a rotating mechanical device, which may wear down and possibly fail. This potential for failure results in relatively low reliability.

An example of a conventional non-volatile RAM is flash memory. Although a flash memory device does not use a rotating mechanical device, flash memory devices have lower reading and writing speeds, shorter lifetimes, and smaller storage capacities relative to HDDs. Also, flash memory devices have relatively high manufacturing costs.

Another type of information storage device uses movement of a magnetic domain wall of a magnetic material. A magnetic domain is a minute magnetic region in which magnetic moments are arranged in a direction in a ferromagnetic material. A magnetic domain wall is a border region between adjacent magnetic domains having different magnetization directions. Magnetic domains and magnetic domain walls may be moved by supplying a current to a magnetic track. Information storage devices having relatively large storage capacities, but do not use a rotating mechanical device, may be realized by using movement of magnetic domains and magnetic domain walls.

SUMMARY

Example embodiments provide magneto-resistive devices and information storage devices including the same.

Example embodiments also provide methods of operating information storage devices.

Additional aspects will be set forth in part in the description which follows and, in part, will be apparent from the description, or may be learned by practice of the example embodiments discussed herein.

At least one example embodiment provides an information storage device. According to at least this example embodiment, the information storage device includes: a magnetic track and a magnetic domain wall moving unit. The magnetic track includes a plurality of magnetic domains and a magnetic domain wall between each pair of adjacent magnetic domains. The magnetic domain wall moving unit is configured to move at least the magnetic domain wall. The information storage device further includes a magneto-resistive device configured to read information recorded on the magnetic track. The magneto-resistive device includes: a pinned layer having a fixed magnetization direction; a free layer; and a separation layer. The free layer is disposed between the pinned layer and the magnetic track and has a magnetization easy axis, which is non-parallel to the magnetization direction of the pinned layer. The separation layer is arranged between the pinned layer and free layer.

According to at least some example embodiments, the pinned layer may have in-plane magnetic anisotropy, whereas the free layer may have perpendicular magnetic anisotropy.

When the pinned layer and the free layer have in-plane magnetic anisotropy, the fixed magnetization direction of the pinned layer and the magnetization easy axis of the free layer may be perpendicular or substantially perpendicular to each other. Alternatively, the fixed magnetization direction of the pinned layer and the magnetization easy axis of the free layer may form an acute angle or an obtuse angle.

When the free layer has in-plane magnetic anisotropy, the magnetization easy axis of the free layer may be determined according to shape anisotropy. In this case, a ratio (x/y) between a minor axis length (x) and a major axis length (y) of the free layer may satisfy $1/10 \leq x/y < 1$.

According to at least some example embodiments, the magnetization easy axis of the free layer may be perpendicular to the magnetic track. Alternatively, the magnetization easy axis of the free layer may be parallel to the magnetic track. The magnetic track may have in-plane magnetic anisotropy. Alternatively, the magnetic track may have perpendicular magnetic anisotropy.

According to at least some example embodiments, the information storage device may further include an insulation layer between the magnetic track and the free layer.

A distance between the magnetic track and the free layer may be between about 1 nm to about 1000 nm.

The information storage device may further include a write unit configured to record information on the magnetic track.

At least one other example embodiment provides a magneto-resistive device includes: a pinned layer; a free layer; and a separation layer. The pinned layer has a fixed magnetization direction, and the free layer has a magnetization easy axis perpendicular to the magnetization direction of the pinned layer. The separation layer is arranged between the pinned layer and free layer. One of the pinned layer and free layer has in-plane magnetic anisotropy, whereas an other of the pinned layer and free layer has perpendicular magnetic anisotropy.

According to at least some example embodiments, the pinned layer may have in-plane magnetic anisotropy, and the free layer may have perpendicular magnetic anisotropy.

At least one other example embodiment provides an information read method for an information storage device. The information storage device includes: a magnetic track and a magnetic domain wall moving unit. The magnetic track has a plurality of magnetic domains and a magnetic domain wall between each pair of adjacent magnetic domains. The magnetic domain wall moving unit is configured to move at least the magnetic domain wall. The information storage device further includes a magneto-resistive device configured to read information recorded on the magnetic track. According to at least this example embodiment, the method includes: moving the magnetic domain wall of the magnetic track; and measuring a variation in resistance of the magneto-resistive device, which is due to a stray field of the magnetic domain wall.

According to at least some example embodiments, the magneto-resistive device may include a pinned layer having a fixed magnetization direction; a free layer disposed between the pinned layer and the magnetic track; and a separation layer between the pinned layer and free layer. The free layer may have a magnetization easy axis, which is non-parallel to the fixed magnetization direction of the pinned layer. A magnetization direction of the free layer may vary due to the stray field of the magnetic domain wall.

According to at least some example embodiments, the pinned layer and the free layer may have in-plane magnetic anisotropy. In this case, the fixed magnetization direction of the pinned layer and the magnetization easy axis of the free layer may be perpendicular to each other. Alternatively, the fixed magnetization direction of the pinned layer and the magnetization easy axis of the free layer may form an acute angle or an obtuse angle.

The pinned layer may have in-plane magnetic anisotropy, whereas the free layer may have perpendicular magnetic anisotropy.

BRIEF DESCRIPTION OF THE DRAWINGS

Example embodiments will become more apparent and readily appreciated from the following description of the accompanying drawings in which.

DETAILED DESCRIPTION

Figure 1:
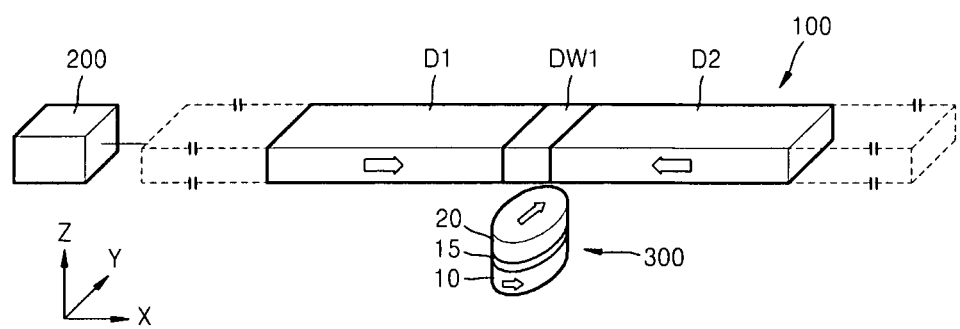
FIG. 1 is a perspective view of an information storage device including a magneto-resistive device according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. General inventive concepts of example embodiments may, however, be embodied in many alternate forms and should not be construed as limited to only the example embodiments set forth herein.

Accordingly, while general inventive concepts are capable of various modifications and alternative forms, embodiments thereof are shown by way of example in the drawings and will herein be described in detail. It should be understood, however, that there is no intent to limit example embodiments to the particular forms disclosed, but on the contrary example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or," includes any and all combinations of one or more of the associated listed items.

When an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (for example, "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 is a perspective view of an information storage device including a magneto-resistive device according to an example embodiment.

Referring to FIG. 1, the information storage device includes a magnetic track 100 extending in a first direction, (e.g., an X-axis direction). The magnetic track 100 includes a plurality of magnetic domains D1 and D2 arranged in a row along the extension direction of the magnetic track 100. For the sake of clarity, only a first magnetic domain D1 and a second magnetic domain D2 are shown in FIG. 1. Although two magnetic domains are illustrated in FIG. 1, the magnetic track 100 may include a larger number of magnetic domains. A magnetic domain wall DW1 exists between the first and second magnetic domains D1 and D2. In this example, the first and second magnetic domains D1 and D2 are magnetized in opposite directions.

The magnetic track 100 may have, for example, an in-plane magnetic anisotropy. In this case, the first magnetic domain D1 is magnetized in an X-axis direction and the second magnetic domain D2 is magnetized in a reverse X-axis direction. Arrows marked on the first and second magnetic domains D1 and D2 represent their magnetization directions. The magnetic domain wall DW1 may be a vortex type magnetic domain wall (hereinafter referred to as a vortex wall) having a magnetization direction rotating in a clockwise or counter-clockwise direction on an XY plane. Alternatively, the magnetic domain wall DW1 may also be a transverse type magnetic domain wall transverse type (hereinafter referred to as a transverse wall) having a magnetization direction parallel to a Y axis. The vortex wall and the transverse wall have different type horizontal magnetization directions. In some cases, the magnetic domain wall DW1 may have a vertical magnetization (e.g., a magnetization direction parallel to a Z axis).

Still referring to FIG. 1, the information storage device includes a magnetic domain wall moving unit (or circuit) 200 configured to move the magnetic domain wall DW1. The magnetic domain wall moving unit 200 is connected to at least one of two ends of the magnetic track 100.

In one example, the magnetic domain wall moving unit 200 may include a current source and a switching device. In this example, the current source is connected to the magnetic track 100, and the switching device is connected between the current source and the magnetic track 100. The magnetic domain wall moving unit 200 may supply a current to the magnetic track 100 so as to move the magnetic domain wall DW1 in the magnetic track 100. A movement direction of the magnetic domain wall DW1 differs according to a direction of the current. The direction of the current is opposite to a direction of electrons, and thus, the magnetic domain wall DW1 moves in a direction opposite to the direction of the current. The movement of the magnetic domain wall DW1 also results in the movement of the first and second magnetic domains D1 and D2. Thus, the magnetic domain wall moving unit 200 is configured to move the magnetic domain wall DW1 and the first and second magnetic domains D1 and D2. The magnetic domain wall moving unit 200 is not limited to the above description, but may be variously modified.

Still referring to FIG. 1, the magneto-resistive device 300 is separated from the magnetic track 100, and may be disposed above or below the magnetic track 100. The distance between the magnetic track 100 and the magneto-resistive device 300 may be, for example, from between about 1 nm to about 1000 nm, inclusive. An insulation layer (not shown) may be formed between the magnetic track 100 and the magneto-resistive device 300. Although the magneto-resistive device 300 in FIG. 1 has a round pillar shape, the magneto-resistive device 300 may have other shapes (e.g., a square pillar shape).

The magneto-resistive device 300 may function as a read unit for reproducing information recorded on the magnetic track 100.

As shown in FIG. 1, the magneto-resistive device 300 includes a separation layer 15 arranged between a pinned layer 10 and a free layer 20. The pinned layer 10 has a fixed magnetization direction, whereas the free layer 20 has a variable magnetization direction. In the example embodiment shown in FIG. 1, the free layer 20 is disposed more adjacent to the magnetic track 100 relative to the pinned layer 10. For example, the free layer 20 is disposed between the pinned layer 10 and the magnetic track 100.

Each of the pinned layer 10 and the free layer 20 may be formed of a ferromagnetic material containing at least one of cobalt (Co), nickel (Ni) and iron (Fe), and materials for forming the pinned layer 10 and the free layer 20 may be the same or different. The separation layer 15 may be an insulation layer (e.g. a magnesium oxide layer or the like) or a conductive layer.

The magnetization direction of the pinned layer 10 and a magnetization easy axis of the free layer 20 may be non-parallel or anti-parallel to each other. For example, the magnetization direction of the pinned layer 10 and the magnetization easy axis of the free layer 20 may be perpendicular to each other. Alternatively, the magnetization direction of the pinned layer 10 and the magnetization easy axis of the free layer 20 may form an acute angle ($0°<\theta_1<90°$) or an obtuse angle ($90°<\theta_2<180°$). If the magnetization direction of the pinned layer 10 and the magnetization easy axis of the free layer 20 are perpendicular to each other, as illustrated in FIG. 1, the pinned layer 10 may have a magnetization direction parallel to an X axis and the free layer 20 may have a magnetization easy axis parallel to the Y axis.

A magnetization easy axis represents an axis direction in which magnetization occurs more easily. The magnetization direction of the free layer 20 may be parallel to the magnetization easy axis when an external magnetic field does not influence the free layer 20. The magnetization direction of the free layer 20 may vary according to a stray field of the magnetic domain wall DW1 of the magnetic track 100. For example, if the magnetic domain wall DW1 moves, the stray field may be applied to the free layer 20 and the magnetization direction of the free layer 20 may vary accordingly. If the magnetization direction of the free layer 20 varies, an electrical resistance of the magneto-resistive device 300 may vary accordingly.

The information recorded on the magnetic track 100 may be read by detecting a variation in resistance of the magneto-resistive device 300. A detailed description thereof will be provided later.

Although not shown in FIG. 1, at least one layer for fixing the magnetization direction of the pinned layer 10 may be formed on a lower surface of the pinned layer 10. The at least one layer for fixing the magnetization direction of the pinned layer 10 may be a single anti-ferromagnetic layer or a multi-layer structure including a conductive layer, a ferromagnetic layer and an anti-ferromagnetic layer. If a multi-layer structure is used, a conductive layer, a ferromagnetic layer and an anti-ferromagnetic layer may be sequentially formed on the lower surface of the pinned layer 10. In this case, the ferromagnetic layer may function as a second pinned layer having a magnetization direction opposite to the magnetization direction of the pinned layer 10. The anti-ferromagnetic layer may fix the magnetization direction of the ferromagnetic layer and the magnetization direction of the pinned layer 10 may be fixed to be opposite to the magnetization direction of the ferromagnetic layer. As such, the magnetization direction of the pinned layer 10 may be fixed in one direction. Methods for fixing the magnetization direction of the pinned layer 10 is not limited to the above description.

Still referring to FIG. 1, the magnetization easy axis of the free layer 20 may be determined according to shape anisotropy. For example, a direction of the magnetization easy axis of the free layer 20 may be determined according to the shape of the free layer 20. In order to make the magnetization easy axis of the free layer 20 parallel to the Y axis as illustrated in FIG. 1, the free layer 20 may extend in a Y-axis direction. For example, if the free layer 20 has a Y-axis length longer than an X-axis length, the free layer 20 may have a magnetization easy axis parallel to the Y axis. In this case, a ratio (x/y) between a minor axis length (x) and a major axis length (y) of the free layer 20 may be greater than or equal to about 1/10, but smaller than or equal to about 1 (e.g., $1/10 \leq x/y < 1$).

However, the magnetization easy axis of the free layer 20 need not be determined according to shape anisotropy. Rather, the magnetization easy axis of the free layer 20 may also be determined according to induced anisotropy. Alternatively, the magnetization easy axis of the free layer 20 may be influenced by both shape anisotropy and induced anisotropy. Thus, the ratio (x/y) between the minor axis length (x) and the major axis length (y) of the free layer 20 is not limited to the above-mentioned range of values.

In the information storage device illustrated in FIG. 1, a resistance variation amount of the magneto-resistive device 300 according to magnetization direction variations of the free layer 20 may be relatively large because the magnetization direction of the pinned layer 10 and the magnetization easy axis of the free layer 20 are non-parallel (e.g., perpendicular) to each other. As a result, the size of a read signal increases. A more detailed description thereof will now be provided with reference to FIG. 2.

Figure 2:
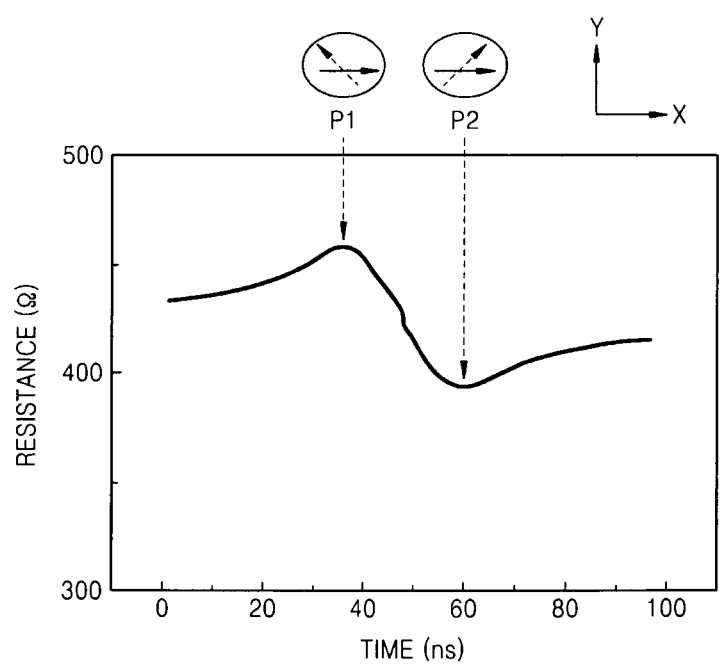
FIG. 2 is a graph showing example resistance variations of a magneto-resistive device according to movement of a magnetic domain wall in the information storage device illustrated in FIG. 1.

FIG. 2 is a graph showing example resistance variations of a magneto-resistive device according to movement of the magnetic domain wall DW1 in the information storage device illustrated in FIG. 1. FIG. 2 will be described in conjunction with FIG. 1.

In more detail, FIG. 2 shows a result obtained by moving the magnetic domain wall DW1 from a left side to a right side of the magneto-resistive device 300. The result is substantially the same as that measured by moving the magneto-resistive device 300 from the second magnetic domain D2 to the first magnetic domain D1, however, the magneto-resistive device 300 is fixed and the magnetic domain wall DW1 and the first and second magnetic domains D1 and D2 are moved in the magnetic track 100. In the example shown in FIG. 2, an X-axis length and a Y-axis length of the free layer 20 are about 200 nm and about 400 nm, respectively. The distance between the magnetic track 100 and the free layer 20 is about 500 nm and the magnetic domain wall DW1 is a vortex wall.

Referring to FIG. 2, as time passes (e.g., as the magnetic domain wall DW1 approaches and then recedes from the magneto-resistive device 300) a resistance variation amount of the magneto-resistive device 300 is relatively large. A resistance of the magneto-resistive device 300 increases to a first point (e.g., a relative maximum value) P1 from a first intermediate value, decreases to a second point (e.g., a relative minimum value) P2, and then re-increases to a second intermediate value, which is somewhat lower than the first intermediate value. A middle point between the first and second points P1 and P2 refers to a point when the magnetic domain wall DW1 is the most adjacent to the magneto-resistive device 300. A magnetization direction of the free layer 20 at the first point P1 rotates in a counterclockwise direction from a Y-axis direction to a certain degree. The magnetization direction of the pinned layer 10 is fixed in an X-axis direction. Solid-line arrows in circles represent the magnetization direction of the pinned layer 10, whereas dashed-line arrows in the circles represent the magnetization direction of the free layer 20. As shown in FIG. 2, the magnetization directions of the pinned layer 10 and the free layer 20 form an anti-parallel state to a certain degree. This state is referred to as a semi anti-parallel state.

Still referring to FIG. 2, the magnetization direction of the free layer 20 at the second point P2 rotates in a clockwise direction from the Y-axis direction to a certain degree. Thus, the magnetization directions of the pinned layer 10 and the free layer 20 form a parallel state to a certain degree. This state is referred to as a semi parallel state.

In the example shown in FIG. 2, the resistance variation amount of the magneto-resistive device 300 are relatively large because the magnetization directions of the pinned layer 10 and the free layer 20 change between the semi anti-parallel state and the semi parallel state. Even if the magnetization direction of the pinned layer 10 and a magnetization easy axis of the free layer 20 are not perpendicular to each other, but form an acute or obtuse angle, the magnetization directions of the pinned layer 10 and the free layer 20 may be changed between the anti-parallel state (or the semi anti-parallel state) and the parallel state (or the semi parallel state) as the magnetization direction of the free layer 20 varies. Thus, even in this case, the resistance variation amount of the magneto-resistive device 300 is relatively large. However, if the magnetization direction of the pinned layer 10 and the magnetization easy axis of the free layer 20 are parallel to each other, the magnetization direction of the free layer 20 changes while maintaining the semi parallel state (or the semi anti-parallel state) with respect to the magnetization direction of the pinned layer 10. Thus, the resistance variation amount of the magneto-resistive device 300 may be relatively small.

Figure 3:
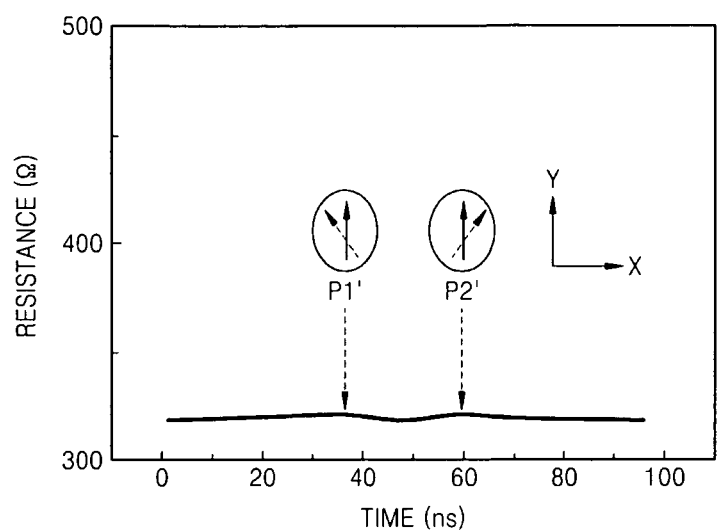
FIGS. 3 and 4 are graphs example showing resistance variations of a magneto-resistive device according to movement of a magnetic domain wall in an information storage device, according to comparative examples.
Figure 4:
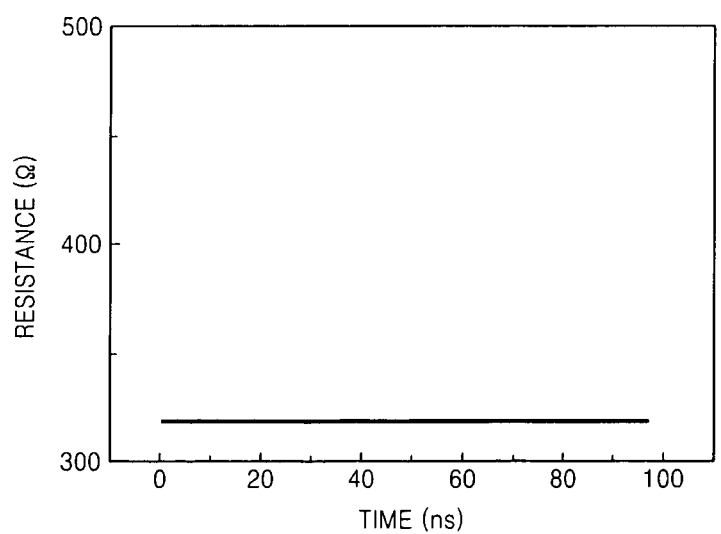

FIGS. 3 and 4 are example graphs showing resistance variations of a magneto-resistive device according to movement of a magnetic domain wall in an information storage device, according to comparative examples.

FIG. 3 shows a result obtained in an information storage device that has the structure illustrated in FIG. 1 and in which both a magnetization direction of a pinned layer and a direction of a magnetization easy axis of a free layer are a Y-axis direction. In this example, an X-axis length and a Y-axis length of the free layer are about 200 nm and about 400 nm, respectively. The distance between a magnetic track and the free layer is about 500 nm and the magnetic domain wall is a vortex wall. The information storage device used to obtain the result of FIG. 3 is the same as the information storage device used to obtain the result of FIG. 2, except that the magnetization direction of the pinned layer is the Y-axis direction.

FIG. 4 shows a result obtained in an information storage device that has the structure illustrated in FIG. 1 and in which both the magnetization direction of the pinned layer and the direction of the magnetization easy axis of the free layer are an X-axis direction. In this example, the X-axis length and the Y-axis length of the free layer are about 400 nm and about 200 nm, respectively. The distance between the magnetic track and the free layer is about 500 nm and the magnetic domain wall is a vortex wall.

Referring to FIG. 3, the resistance variations of the magneto-resistive device according to movement of the magnetic domain wall is relatively small. In more detail, magnetization directions of the pinned layer and the free layer form a first semi parallel state at a point P1' corresponding to the first point P1 of FIG. 2 and form a second semi parallel state at a point P2' corresponding to the second point P2 of FIG. 2. As such, both the points P1' and P2' form a semi parallel state, and thus, resistances of the magneto-resistive device at the points P1' and P2' may be similar or substantially similar to each other.

Meanwhile, in FIG. 4, the resistance variations of the magneto-resistive device according to movement of the magnetic domain wall occurs relatively rarely.

The results of FIGS. 2 through 4 show that an resistance variation amount of a magneto-resistive device when a magnetization direction of a pinned layer is anti-parallel to a magnetization easy axis of a free layer (FIG. 2) is larger than when the magnetization direction of the pinned layer is parallel to the magnetization easy axis of the free layer (FIGS. 3 and 4). A relatively large resistance variation amount of the magneto-resistive device indicates that the size of a read signal is relatively large.

Figure 5:
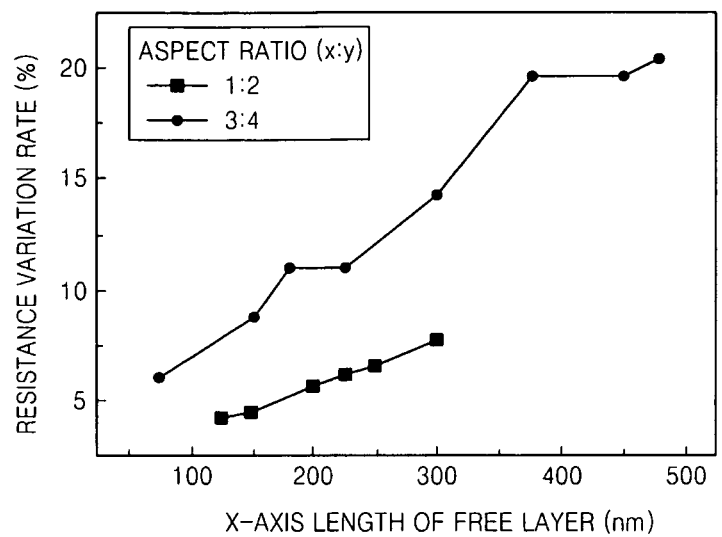
FIG. 5 is a graph showing an example resistance variation rate (%) of a magneto-resistive device according to an aspect ratio of a free layer in the information storage device illustrated in FIG. 1.

FIG. 5 is a graph showing an example resistance variation rate (%) of the magneto-resistive device 300 according to an aspect ratio of the free layer 20 in the information storage device illustrated in FIG. 1.

In FIG. 5, when a ratio (x:y) between an X-axis length and a Y-axis length of the free layer 20 (e.g., the aspect ratio of the free layer 20) is about 1:2 and about 3:4, the resistance variation rate (%) of the magneto-resistive device 300 is measured by increasing the X-axis length. In this example, the resistance variation rate (%) is [(R1−R2)/R2]×100, where R1 represents a relative maximum resistance (e.g., a resistance value corresponding to the first point P1 of FIG. 2) and R2 represents a relative minimum resistance (e.g., a resistance value corresponding to the second point P2 of FIG. 2). The result of FIG. 5 is obtained when a magnetization easy axis of the free layer 20 is determined according to shape anisotropy.

Referring to FIG. 5, when the ratio (x:y) between the X-axis length and the Y-axis length of the free layer 20 is 3:4, the resistance variation rate (%) is larger than when the ratio (x:y) is 1:2. Accordingly, the resistance variation rate (%) may be increased as the ratio (x:y) between the X-axis length and the Y-axis length of the free layer 20 gets closer to 1:1. In both cases, the resistance variation rate (%) increases as the X-axis length of the free layer 20 is increased.

Figure 6:
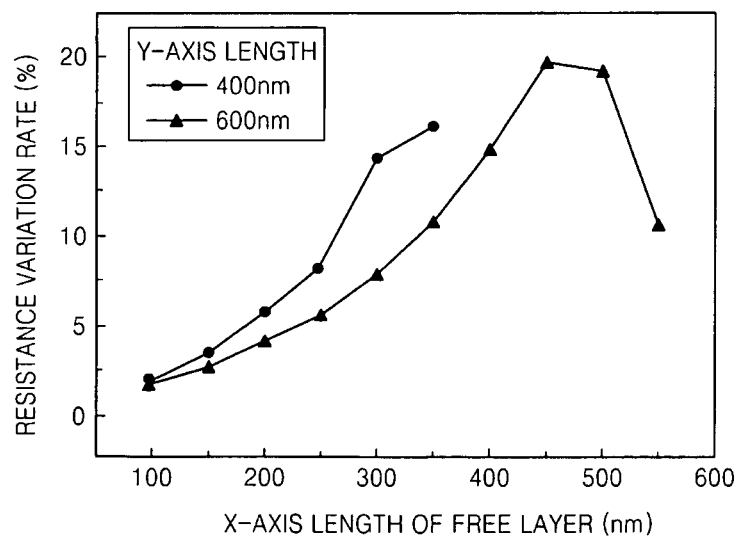
FIG. 6 is a graph showing an example resistance variation rate (%) of a magneto-resistive device, which is measured by varying an X-axis length of the free layer when a Y-axis length of a free layer is fixed in the information storage device illustrated in FIG. 1.

FIG. 6 is a graph showing an example resistance variation rate (%) of the magneto-resistive device 300, which is measured by varying an X-axis length of the free layer 20 when a Y-axis length of the free layer 20 is fixed in the information storage device illustrated in FIG. 1. FIG. 6 shows a result obtained by fixing the Y-axis length of the free layer 20 at about 400 nm and about 600 nm and increasing the X-axis length of the free layer 20 from about 100 nm by about 50 nm at a time.

Referring to FIG. 6, when the Y-axis length of the free layer 20 is about 400 nm, the resistance variation rate (%) increases as the X-axis length of the free layer 20 is increased to about 350 nm. Although the X-axis length of the free layer 20 is increased to about 350 nm, a magnetization easy axis of the free layer 20 is maintained in a Y-axis direction due to shape anisotropy. In this case, the resistance variation rate (%) increases as the X-axis length of the free layer 20 is increased. Meanwhile, when the Y-axis length of the free layer 20 is about 600 nm, the resistance variation rate (%) increases as the X-axis length of the free layer 20 is increased to about 450 nm, but decreases as the X-axis length of the free layer 20 exceeds about 500 nm. When the Y-axis length of the free layer 20 is about 600 nm, the magnetization easy axis of the free layer 20 is maintained in the Y-axis direction due to shape anisotropy until the X-axis length of the free layer 20 reaches about 500 nm. As such, if the magnetization easy axis of the free layer 20 is maintained in the Y-axis direction, the resistance variation rate (%) may be increased as the X-axis length of the free layer 20 is increased. However, as the X-axis length of the free layer 20 increases over about 500 nm, maintaining the magnetization easy axis of the free layer 20 in the Y-axis direction becomes more difficult. As a result, the resistance variation rate (%) decreases. The result of FIG. 6 is obtained when the magnetization easy axis of the free layer 20 is determined according to shape anisotropy.

If the magnetization easy axis of the free layer 20 is influenced by induced anisotropy, the above results may differ. For example, although the X-axis length of the free layer 20 is larger than the Y-axis length of the free layer 20, the resistance variation rate (%) may not decrease, but may be maintained at a relatively high level.

In the information storage device illustrated in FIG. 1, the pinned layer 10 has a magnetization direction parallel to the magnetic track 100 and the free layer 20 has a magnetization easy axis perpendicular to the magnetic track 100. However, according to at least one other example embodiment, the magnetization direction of the pinned layer 10 and a direction of the magnetization easy axis of the free layer 20 may be exchanged with each other as illustrated in FIG. 7.

Figure 7:
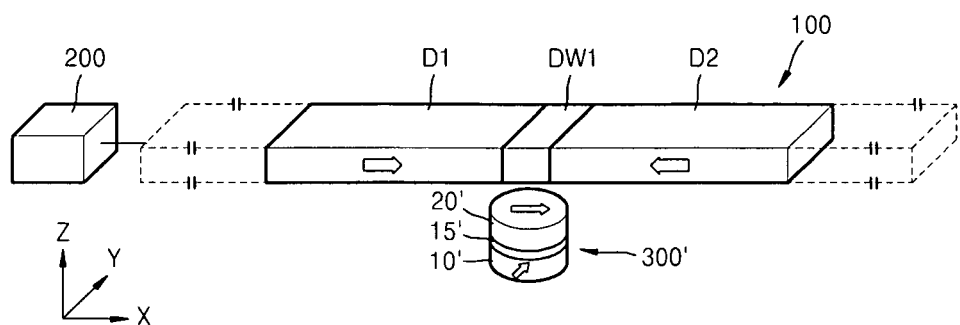
FIGS. 7 through 9 are perspective views of an information storage device including a magneto-resistive device according to other example embodiments.

Referring to FIG. 7, the magneto-resistive device 300' includes a pinned layer 10' and a free layer 20', which are separated from each other by a separation layer 15' formed there between. In this example, the pinned layer 10' has a magnetization direction parallel to a Y axis and the free layer 20' has a magnetization easy axis parallel to an X axis. That is, for example, the magnetization direction of the pinned layer 10' is perpendicular to an extension direction of the magnetic track 100, whereas the magnetization easy axis of the free layer 20' is parallel to the extension direction of the magnetic track 100. If the magnetization easy axis of the free layer 20' is determined according to shape anisotropy, the free layer 20' has an X-axis length longer than a Y-axis length. Also, in the information storage device illustrated in FIG. 7, a resistance variation amount of the magneto-resistive device 300' according to magnetization direction variations of the free layer 20 may be relatively large because the magnetization direction of the pinned layer 10' and the magnetization easy axis of the free layer 20' are anti-parallel (e.g., perpendicular) to each other.

According to at least one other example embodiment, the magnetization direction of the pinned layer 10' and the magnetization easy axis of the free layer 20' may not be perpendicular to each other, but may form an acute or obtuse angle.

The information storage devices illustrated in FIGS. 1 and 7 are described assuming that the pinned layers 10 and 10' and the free layers 20 and 20' have in-plane magnetic anisotropy. However, according to at least one other example embodiment, one of the pinned layer 10, 10' and the free layer 20, 20' may have in-plane magnetic anisotropy and the other of the pinned layer 10, 10' and the free layer 20, 20' may have perpendicular magnetic anisotropy as illustrated in FIG. 8.

Figure 8:
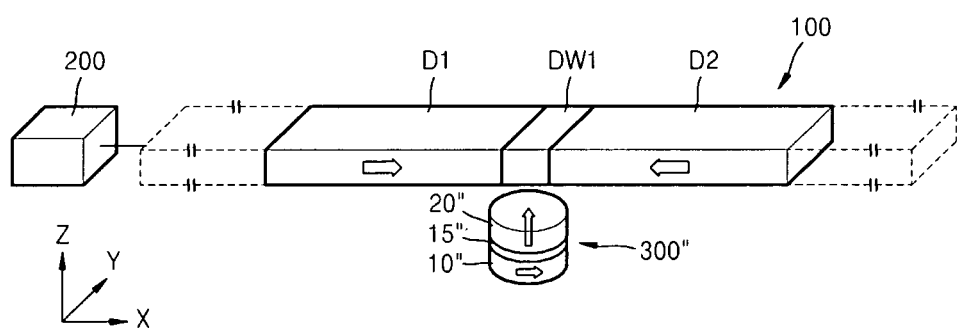

Referring to FIG. 8, a magneto-resistive device 300" includes a pinned layer 10" and a free layer 20", which are separated from each other by a separation layer 15" formed there between. In this example, the pinned layer 10" has in-plane magnetic anisotropy, whereas the free layer 20" has perpendicular magnetic anisotropy. Like the pinned layer 10 illustrated in FIG. 1, the pinned layer 10" has a magnetization direction parallel to an X axis. The free layer 20" has a magnetization easy axis parallel to a Z axis. Thus, the magnetization direction of the pinned layer 10" and the magnetization easy axis of the free layer 20" are perpendicular to each other. If the free layer 20" has a magnetization easy axis parallel to the Z axis as described above, the magnetization easy axis of the free layer 20" may be determined according to crystal anisotropy.

Figure 9:
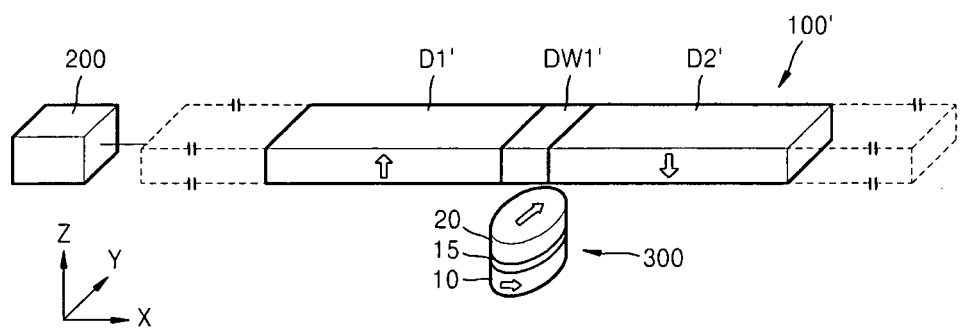

The information storage devices illustrated in FIGS. 1, 7 and 8 are described assuming that the magnetic track 100 has in-plane magnetic anisotropy. However, a magnetic track having perpendicular magnetic anisotropy may also be used as illustrated in FIG. 9. The information storage device illustrated in FIG. 9 is modified from the information storage device illustrated in FIG. 1.

Referring to FIG. 9, the magnetic track 100' has a perpendicular magnetic anisotropy. In this case, first and second magnetic domains D1' and D2' are magnetized in a Z-axis direction and a reverse Z-axis direction, respectively. The magnetic domain wall DW1' may be a bloch wall or a neel wall. The bloch wall may have a magnetization direction parallel to a Y axis, whereas the neel wall may have a magnetization direction parallel to an X axis. All elements illustrated in FIG. 9 other than the magnetic track 100' may be the same or substantially the same as those illustrated in FIG. 1.

The magnetic track 100' having perpendicular magnetic anisotropy may also be used in the information storage devices illustrated in FIGS. 7 and 8.

Figure 10:
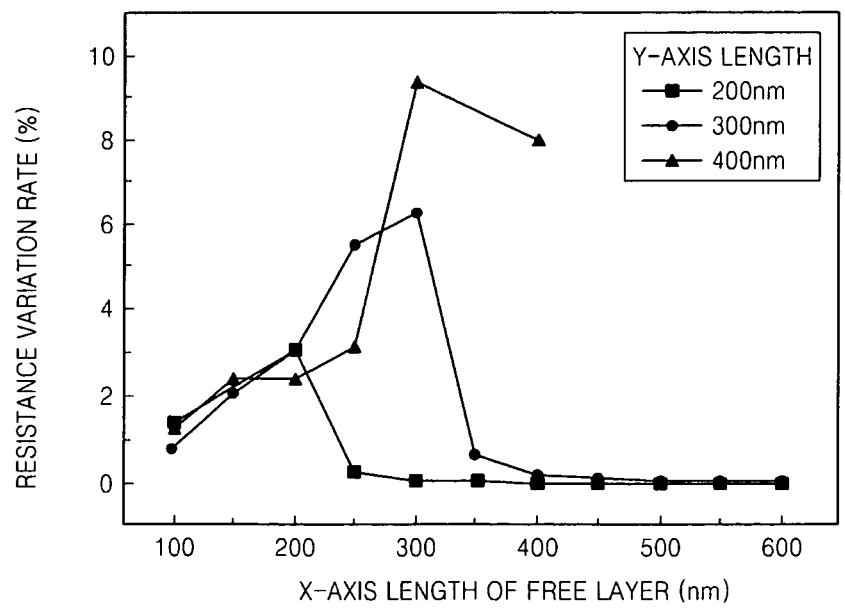
FIG. 10 is a graph showing an example resistance variation rate (%) of a magneto-resistive device, which is measured by varying an X-axis length of the free layer when a Y-axis length of a free layer is fixed in the information storage device illustrated in FIG. 9.

FIG. 10 is a graph showing an example resistance variation rate (%) of the magneto-resistive device 300, which is measured by varying an X-axis length of the free layer 20 when a Y-axis length of the free layer 20 is fixed in the information storage device illustrated in FIG. 9. FIG. 10 shows a result obtained by fixing the Y-axis length of the free layer 20 at about 200 nm, about 300 nm and about 400 nm and increasing the X-axis length of the free layer 20 from about 100 nm by about 50 nm at a time. The result of FIG. 10 is obtained when a magnetization easy axis of the free layer 20 is determined according to shape anisotropy.

Referring to FIG. 10, when the Y-axis length of the free layer 20 is about 200 nm, the resistance variation rate (%) increases as the X-axis length of the free layer 20 is increased to about 200 nm, but decreases as the X-axis length of the free layer 20 exceeds about 200 nm. When the Y-axis length of the free layer 20 is about 300 nm, the resistance variation rate (%) increases as the X-axis length of the free layer 20 is increase to about 300 nm, but decreases as the X-axis length of the free layer 20 exceeds about 300 nm. When the Y-axis length of the free layer 20 is about 400 nm, the resistance variation rate (%) increases as the X-axis length of the free layer 20 is increased to about 300 nm, but decreases as the X-axis length of the free layer 20 exceeds about 300 nm. The result of FIG. 10 is similar or substantially similar to that of FIG. 6. Thus, although the magnetic track 100' having perpendicular magnetic anisotropy is used, the resistance variation rate (%) increases as the X-axis length of the free layer 20 is increased if the magnetization easy axis of the free layer 20 is maintained in a Y-axis direction due to shape anisotropy. The result of FIG. 10 is obtained when the magnetization easy axis of the free layer 20 is determined according to shape anisotropy. If the magnetization easy axis of the free layer 20 is influenced by induced anisotropy, the above results may differ.

An information read method for an information storage device, according to an example embodiment, will now be described. The information read method uses resistance variations of a magneto-resistive device, which occur due to a stray field of a magnetic domain wall.

Figure 11A:
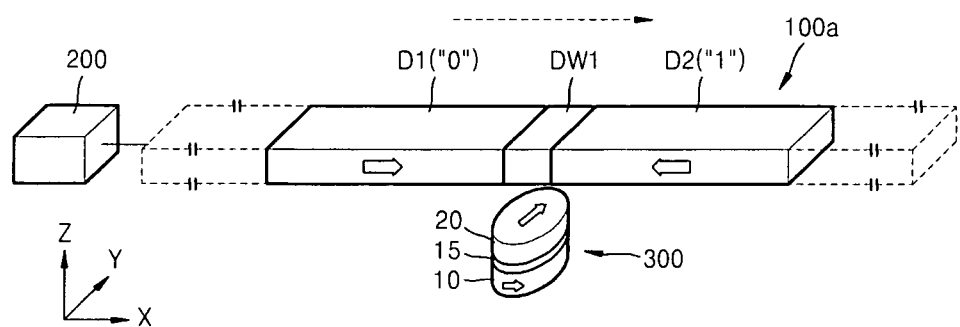
FIGS. 11A and 11B are diagrams for describing a method of operating an information storage device according to an example embodiment.
Figure 11A:
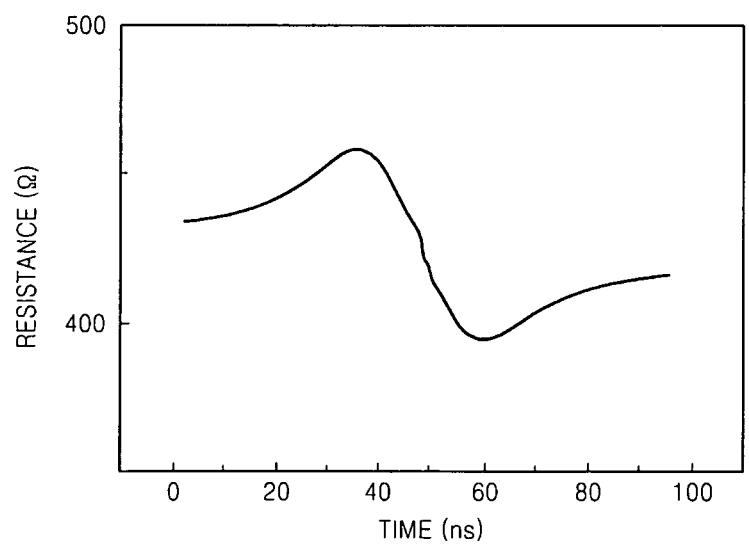
Figure 11B:
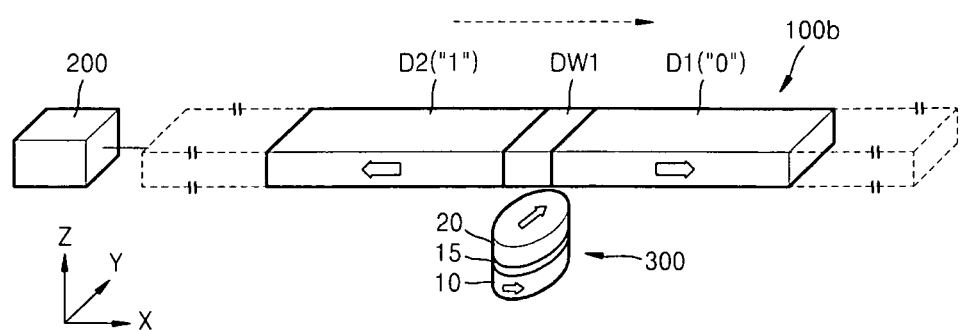
Figure 11B:
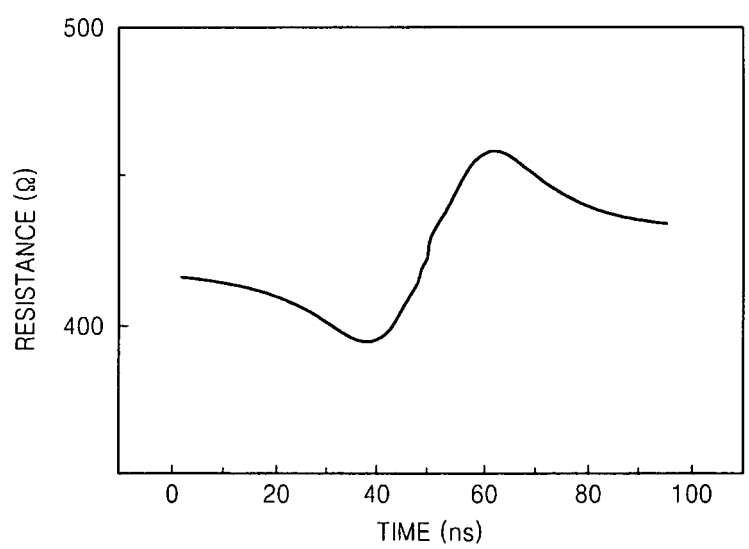

FIGS. 11A and 11B are diagrams for describing a method of operating the information storage device illustrated in FIG. 1 according to an example embodiment.

FIG. 11A is a diagram for describing an information read method using a magnetic track 100a in which first and second magnetic domains D1 and D2 are disposed at left and right sides, respectively, of a magnetic domain wall DW1. In this example, the first magnetic domain D1 magnetized in an X-axis direction corresponds to data "0", whereas the second magnetic domain D2 magnetized in a reverse X-axis direction corresponds to data "1". However, this data correspondence may vary.

Resistance variations of a magneto-resistive device 300, which occur due to a stray field of the magnetic domain wall DW1, are measured by moving the magnetic domain wall DW1 and the first and second magnetic domains D1 and D2 to the right. The resistance variations may be the same or substantially the same as those measured by moving the magneto-resistive device 300 from the second magnetic domain D2 (data "1") to the first magnetic domain D1 (data "0") via the magnetic domain wall DW1. Thus, the information read method illustrated in FIG. 11A is a method of reading data "10". In this example, a resistance of the magneto-resistive device 300 varies and sequentially obtains a relative maximum value and a relative minimum value. For example, the resistance of the magneto-resistive device 300 increases and then decreases. The result of FIG. 11A is similar or substantially similar to that of FIG. 2.

FIG. 11B is a diagram for describing an information read method using a magnetic track 100b in which second and first magnetic domains D2 and D1 are disposed at left and right sides, respectively, of a magnetic domain wall DW1. In this example, the second magnetic domain D2 corresponds to data "1", whereas the first magnetic domain D1 corresponds to data "0". However, this data correspondence may vary.

Resistance variations of a magneto-resistive device 300, which occur due to a stray field of the magnetic domain wall DW1, are measured by moving the magnetic domain wall DW1 and the first and second magnetic domains D1 and D2 to the right. The resistance variations may be the same or substantially the same as those measured by moving the magneto-resistive device 300 from the first magnetic domain D1 (data "0") to the second magnetic domain D2 (data "1") via the magnetic domain wall DW1. Thus, the information read method illustrated in FIG. 11B is a method of reading data "01". In this case, a resistance of the magneto-resistive device 300 varies and sequentially obtains a relative minimum value and a relative maximum value. For example, the resistance of the magneto-resistive device 300 decreases and then increases. The result shown in FIG. 11B is opposite to that of FIG. 11A.

In this example, the resistance variations of the magneto-resistive device 300 when data "10" is read as illustrated in FIG. 11A are opposite to those when data "01" is read as illustrated in FIG. 11B. Thus, whether data "1" is followed by data "0" or data "0" is followed by data "1" may be determined according to a pattern of the resistance variations of the magneto-resistive device 300. If a resistance varies as illustrated in FIG. 11A, data "10" is determined to be read, whereas if a resistance varies as illustrated in FIG. 11B data "01" is determined to be read.

If data "0" or "1" is repeated, the resistance of the magneto-resistive device 300 will not vary for a repetition period. Thus, if the resistance of the magneto-resistive device 300 does not vary for a period, data "0" or "1" is determined to be repeated for the period. For example, if a resistance varies as illustrated in FIG. 11A and then does not vary for a period, data "0" is determined to be repeated for the period. Likewise, if a resistance varies as illustrated in FIG. 11B and then does not vary for a period, data "1" is determined to be repeated for the period. As such, data recorded on a magnetic track may be read.

In the information read methods illustrated in FIGS. 11A and 11B, the structures of the magnetic tracks 100a and 100b and the magneto-resistive device 300 may be variously modified.

Although the above description is made on the assumption that a magnetic track includes two magnetic domains and one magnetic domain wall, the magnetic track may have three or more magnetic domains and two or more magnetic domain walls. In this case, a magnetic domain wall is arranged between each pair of adjacent magnetic domains. Also, an information storage device may further include a write unit for recording information on the magnetic track.

Figure 12:
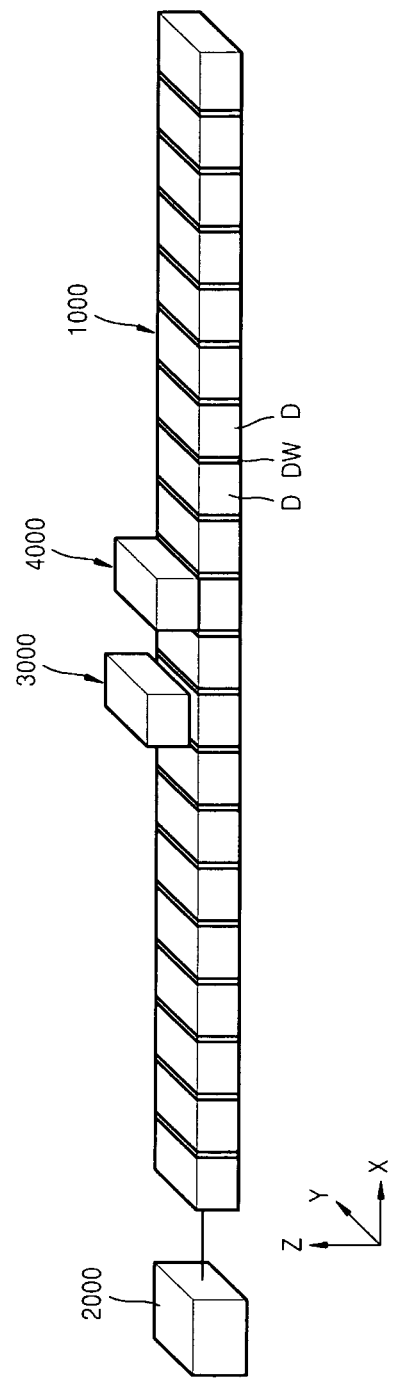
FIG. 12 is a perspective view of an information storage device according to another example embodiment.

FIG. 12 is a perspective view of an information storage device according to another example embodiment.

Referring to FIG. 12, the information storage device according to at least this example embodiment includes a magnetic track 1000 that extends in a first direction (e.g., an X-axis direction). The magnetic track 1000 includes a plurality of magnetic domains D sequentially arranged in a row along the extension direction of the magnetic track 1000. A magnetic domain wall DW exists between each pair of neighboring magnetic domains D. In this example, the magnetic track 1000 has in-plane magnetic anisotropy or perpendicular magnetic anisotropy. The magnetic track 1000 may be used as an information storage element for storing information in each of the magnetic domains D. The structure of the magnetic track 1000 is not limited to the above description and may be variously modified.

The information storage device according to at least the example embodiment shown in FIG. 12 further includes a magnetic domain wall moving unit 2000 connected to the magnetic track 1000. The magnetic domain wall moving unit 2000 may be the same or substantially the same as the magnetic domain wall moving unit 200 illustrated in FIG. 1, and thus, a detailed description thereof will not be repeated here.

The information storage device according to at least the example embodiment shown in FIG. 12 further includes a read unit 3000 and a write unit 4000 disposed on regions of the magnetic track 1000. The read unit 3000 and the write unit 4000 may be disposed on the magnetic track 1000 as illustrated in FIG. 12 or may be disposed under the magnetic track 1000. In some cases, one of the read unit 3000 and the write unit 4000 may be disposed under the magnetic track 1000, whereas the other of the read unit 3000 and the write unit 4000 may be disposed on the magnetic track 1000. Although not shown in FIG. 12, an insulation layer may be formed between the read unit 3000 and the magnetic track 1000. An insulation layer or a conductive layer having a resistivity higher than that of the magnetic track 1000 may be formed between the write unit 4000 and the magnetic track 1000.

The read unit 3000 may have a structure of one of the magneto-resistive devices 300, 300', 300" illustrated in FIGS. 1, 7, 8 and 9. The write unit 4000 may be a recording device using spin transfer torque. In this case, the write unit 4000 may have a structure of a tunnel magneto resistance (TMR) device or a giant magneto resistance (GMR) device. Alternatively, the write unit 4000 may be a device for performing a write operation by using an external magnetic field. In this case, the write unit 4000 may be separate from the magnetic track 1000.

The writing mechanism, the structure and the position of the write unit 4000 are not limited to the above description, but may be variously modified. For example, the write unit 4000 may be disposed at a side surface of the magnetic track 1000, rather than on, above, under or below the magnetic track 1000.

As the magnetic domain wall moving unit 2000 moves the magnetic domains D and the magnetic domain walls DW by supplying a current to the magnetic track 1000, the read unit 3000 or the write unit 4000 may read or write information.

Figure 13:
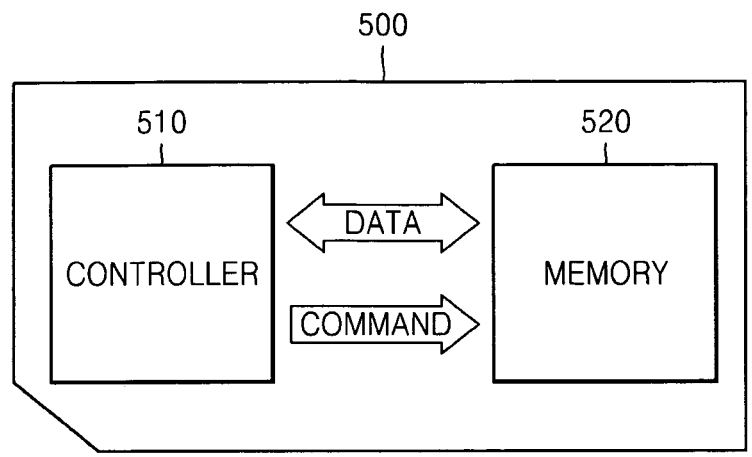
FIG. 13 is a schematic diagram roughly illustrating a memory card 500 according to example embodiments.

FIG. 13 is a schematic diagram illustrating a memory card 500 according to example embodiments. Referring to FIG. 13, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1, 7, 8, 9 and/or 12.

Such a memory card 500 may be used as a storage medium for various portable electronic devices. For example, the memory card 500 may be a multimedia card (MMC) or a secure digital (SD) card.

Figure 14:
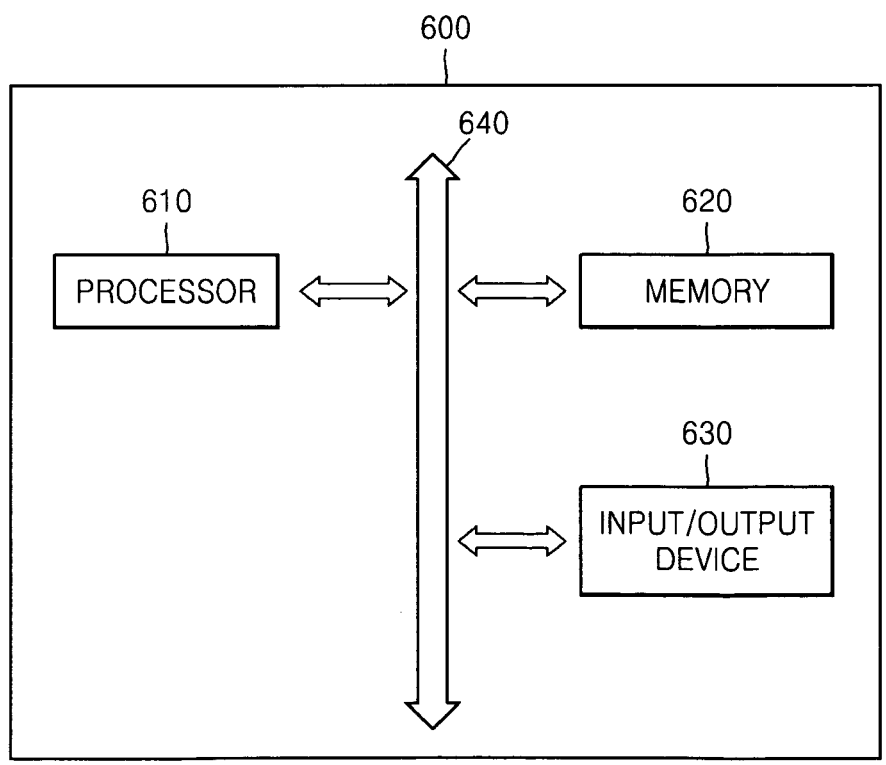
FIG. 14 is a block diagram roughly illustrating an electronic system 600 according to example embodiments.

FIG. 14 is a block diagram roughly illustrating an electronic system 600 according to example embodiments. Referring to FIG. 14, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, for example, a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1, 7, 8, 9 and/or 12.

For example, such an electronic system 600 may embody various electronic control systems requiring the memory 620, and, for example, may be used in mobile phones, MP3 players, navigation devices, solid state disks (SSD), or household appliances.

Figure 15:
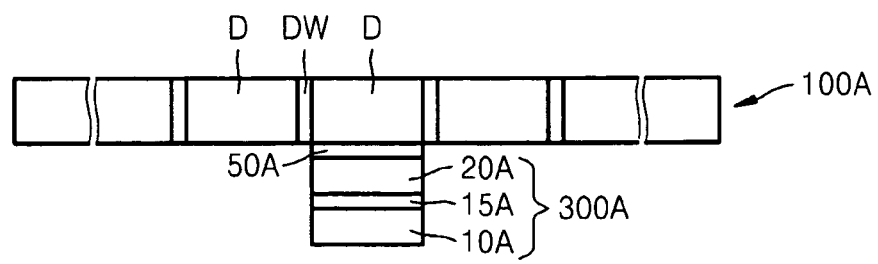
FIG. 15 is a perspective view of an information storage device including an insulation layer between a magnetic track and a free layer, according to an example embodiment.

FIG. 15 is a perspective view of an information storage device including an insulation layer between a magnetic track and a free layer, according to an example embodiment.

FIG. 15 shows a magnetic track 100A having magnetic domains D and magnetic domain walls DW, and a magneto-resistive device 300A. The magneto-resistive device 300A may include a pinned layer 10A, a separation layer 15A, and a free layer 20A. As shown in FIG. 15, an insulation layer 50A may be between the magnetic track 100A and the free layer 20A.

It should be understood that example embodiments described herein should be considered in a descriptive sense only and not for purposes of limitation. For example, it will be understood by one of ordinary skill in the art that a magneto-resistive device according to example embodiments may also be used in other devices as well as the information storage device (memory) using movement of a magnetic domain wall, which is illustrated in FIGS. 1, 7, 8, 9 and/or 12. Furthermore, it will also be understood by one of ordinary skill in the art that the structures of FIGS. 1, 7, 8, 9 and 12 are described for example purposes and may be variously modified. Descriptions of features or aspects within each example embodiment should typically be considered as available for other similar features or aspects in other example embodiments.

What is claimed is:

1. An information storage device comprising:
    a magnetic track having a plurality of magnetic domains and a magnetic domain wall between each pair of adjacent magnetic domains;
    a magnetic domain wall moving unit configured to move at least the magnetic domain wall; and
    a magneto-resistive device configured to read information recorded on the magnetic track, the magneto-resistive device including,
        a pinned layer having a fixed magnetization direction,
        a free layer disposed between the pinned layer and the magnetic track, and having a magnetization easy axis that is non-parallel to the fixed magnetization direction of the pinned layer, and
        a separation layer between the pinned layer and free layer, wherein
            a magnetization direction of the free layer and the fixed magnetization direction of the pinned layer are configured to change between a semi anti-parallel state and a semi parallel state when the magneto-resistive device reads the information, the semi-anti-parallel state being a state in which there is an obtuse angle between the magnetization direction of the free layer and the fixed magnetization direction of the pinned layer, and the semi parallel state being a state in which there is an acute angle between the magnetization direction of the free layer and the fixed magnetization direction of the pinned layer.

2. The information storage device of claim 1, wherein the pinned layer and the free layer have in-plane magnetic anisotropy.

3. The information storage device of claim 2, wherein the fixed magnetization direction of the pinned layer and the magnetization easy axis of the free layer are perpendicular to each other.

4. The information storage device of claim 2, wherein the fixed magnetization direction of the pinned layer and the magnetization easy axis of the free layer form one of an acute angle and an obtuse angle.

5. The information storage device of claim 2, wherein the magnetization easy axis of the free layer is determined according to shape anisotropy.

6. The information storage device of claim 5, wherein a ratio (x/y) between a minor axis length (x) and a major axis length (y) of the free layer satisfies $1/10 \leq x/y < 1$.

7. The information storage device of claim 2, wherein the magnetization easy axis of the free layer is perpendicular to the magnetic track.

8. The information storage device of claim 1, wherein the magnetic track has in-plane magnetic anisotropy.

9. The information storage device of claim 1, wherein the magnetic track has perpendicular magnetic anisotropy.

10. The information storage device of claim 1, further comprising:
    an insulation layer between the magnetic track and the free layer.

11. The information storage device of claim 1, wherein a distance between the magnetic track and the free layer is between about 1 nm and about 1000 nm, inclusive.

12. The information storage device of claim 1, further comprising:
    a write unit configured to record information on the magnetic track.

* * * * *